(12) United States Patent
Lin

(10) Patent No.: US 7,541,116 B2
(45) Date of Patent: Jun. 2, 2009

(54) MASK AT FREQUENCY DOMAIN AND METHOD FOR PREPARING THE SAME AND EXPOSING SYSTEM USING THE SAME

(75) Inventor: Chun Yu Lin, Kaohsiung (TW)

(73) Assignee: Promos Technologies Inc., Hsinchu (TW)

( * ) Notice: Subject to any disclaimer, the term of this patent is extended or adjusted under 35 U.S.C. 154(b) by 664 days.

(21) Appl. No.: 11/254,729

(22) Filed: Oct. 21, 2005

(65) Prior Publication Data

US 2007/0092806 A1 Apr. 26, 2007

(51) Int. Cl.
*G03F 1/00* (2006.01)
(52) U.S. Cl. .................................................. 430/5
(58) Field of Classification Search .................. 430/5, 430/394; 716/19, 20, 21; 355/72
See application file for complete search history.

(56) References Cited

U.S. PATENT DOCUMENTS 6,800,401 B2 * 10/2004 Petersen ........................ 430/5
7,174,531 B2 * 2/2007 Schellenberg et al. ......... 716/19

\* cited by examiner

*Primary Examiner*—Stephen Rosasco
(74) *Attorney, Agent, or Firm*—Oliff & Berridge, PLC

(57) ABSTRACT

A mask at frequency domain comprises a plurality of amplitude patterns positioned on a first surface of the mask and a plurality of phase patterns positioned on a second surface of the mask. The amplitude patterns have different vertical thicknesses to change the amplitude of an exposing light, and the phase patterns have different vertical thicknesses to change the phase of the exposing light. Preferably, the amplitude patterns are made of inorganic material, such as molybdenum silicide (MoSi), and the phase patterns are made of transparent material, such as quartz. The amplitude patterns and phase patterns are the Fourier transform of a circuit layout, and their numbers and positions are correspondent with each other.

27 Claims, 8 Drawing Sheets

MASK AT FREQUENCY DOMAIN AND METHOD FOR PREPARING THE SAME AND EXPOSING SYSTEM USING THE SAME

BACKGROUND OF THE INVENTION (A) Field of the Invention

The present invention relates to a mask at frequency domain and a method for preparing the same and an exposing system using the same, and more particularly, to a mask at frequency domain, which has a plurality of amplitude patterns and a plurality of phase patterns generated from a circuit layout by Fourier transform process, and a method for preparing the same and an exposing system using the same.

(B) Description of the Related Art

FIG. 1 and FIG. 2 illustrate an exposing system 10 according to the prior art. From top to bottom, the exposing system 10 comprises an off-axis illumination (OAI) light source 12, a first lens 14, a mask 20, a second lens 16, a shielding plate 22, a third lens 18, and a wafer 30. The mask 20 includes a circuit layout 62 having two patterns 64 and 66, which are similar to the patterns to be formed on the wafer 30. Particularly, the difference between the patterns to be formed on the wafer 30 and the patterns 64, 66 is their sizes, i.e., the size of the patterns 64, 66 is smaller than that of the patterns to be formed on the wafer. In other words, the mask 20 can be regarded as a mask in spatial domain.

As the critical dimensions of integrated circuits are shrinking, it becomes increasingly difficult for the lithographic process to form a smaller pattern on the wafer 30 since it is more difficult to form patterns with a further reduced size on the mask 20. In addition, the prior art uses the OAI light source 12 to increase the depth of focus (DOF) of the exposing system 10. But the OAI technique can optimize the DOF for only one of these patterns 64 and 66 of the circuit layout 62, while the DOF for the other patterns is not optimized.

SUMMARY OF THE INVENTION

The primary objective of the present invention is to provide a mask at frequency domain having a plurality of amplitude patterns and a plurality of phase patterns generated from a circuit layout by Fourier transform process, a method for preparing the same and an exposing system using the same, of which architecture is simpler and by which patterns of the circuit layout all have an optimal DOF.

In order to achieve the above-mentioned objective and avoid the problems of the prior art, one embodiment of the present invention discloses a mask at frequency domain comprising a plurality of amplitude patterns positioned on a first surface of the mask and a plurality of phase patterns positioned on a second surface of the mask. The amplitude patterns have different vertical thicknesses to change the amplitude of an exposing light, and the phase patterns have different vertical thicknesses to change the phase of the exposing light. Preferably, the amplitude patterns are made of inorganic material such as molybdenum silicide, and the phase patterns are made of transparent material such as quartz. The amplitude patterns and phase patterns are the Fourier transform of a circuit layout. The number and position of the amplitude patterns correspond to those of the phase patterns.

According to one embodiment of the present invention, the method for preparing a mask at frequency domain first performs a Fourier transform process to generate an amplitude layout and a phase layout from a circuit layout, wherein the amplitude layout includes a plurality of first regions having an amplitude value and the phase layout includes a plurality of second regions having a phase value. Subsequently, a plurality of amplitude patterns are formed on a first surface of a substrate and a plurality of phase patterns are formed on a second surface of the substrate, wherein the amplitude pattern has a thickness corresponding to the amplitude value of the first region and the phase pattern has a thickness corresponding to the phase value of the second region.

According to one embodiment of the present invention, the exposing system comprises a mask, a lens positioned between the mask and a wafer, and a coherent light source. Preferably, the coherent light source is a point light source capable of emitting an exposing light to transfer the amplitude pattern and the phase pattern from the mask onto the wafer via the lens. These amplitude patterns and these phase patterns are the Fourier transform of a circuit layout, so that the lens can be regarded as an inverse Fourier transform device. Therefore, the exposing light penetrates through these amplitude patterns, phase patterns and the lens, and interferes to form a circuit layout on the wafer.

Compared to the prior art, which possesses a complex architecture and can optimize the depth of focus for only one of the several patterns in a circuit layout, the embodiment of the present invention possesses a simpler architecture and can optimize the depth of focus for all patterns in a circuit design.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
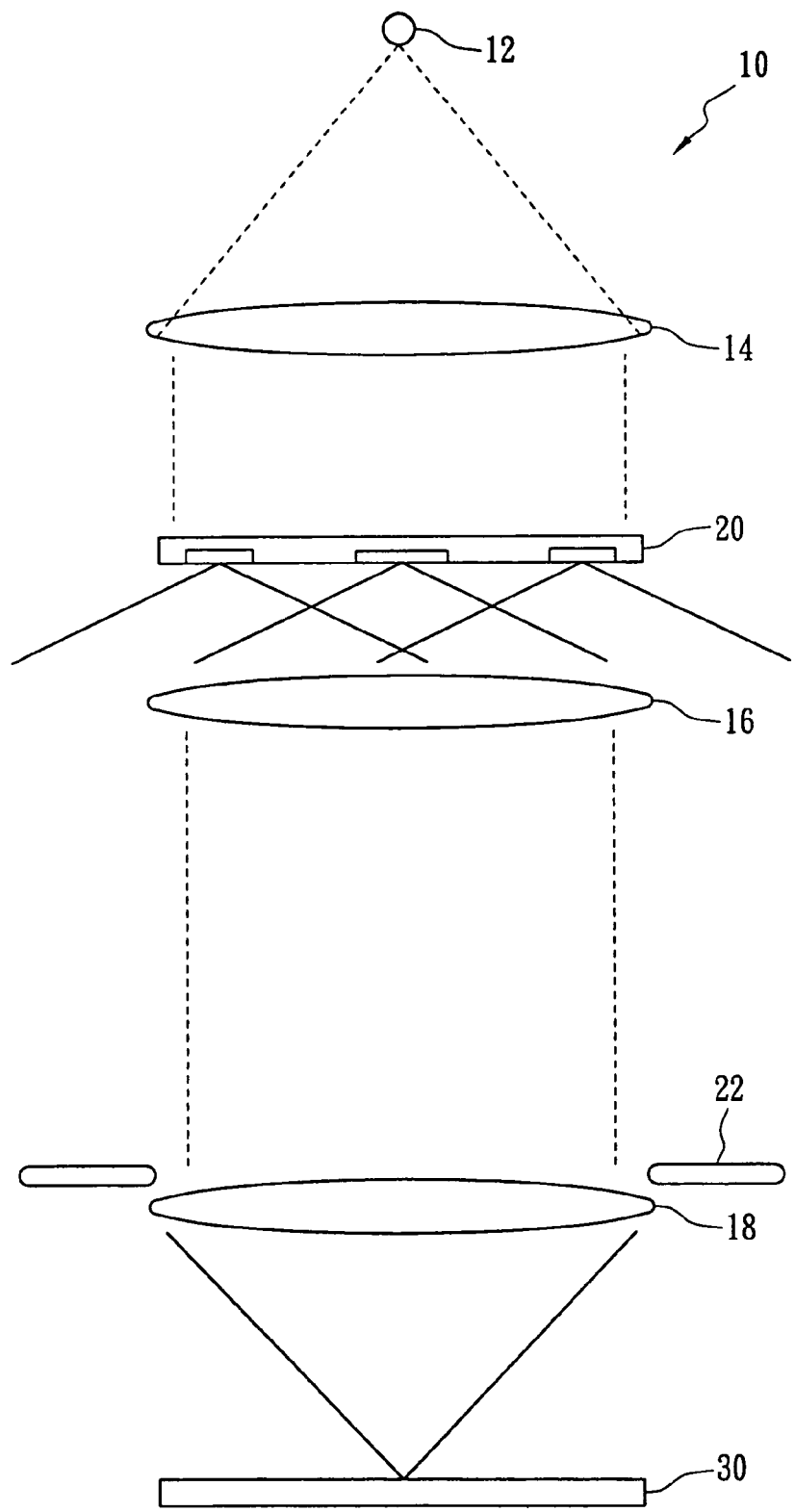
FIG. 1 and FIG. 2 illustrate an exposing system according to the prior art.
Figure 2:
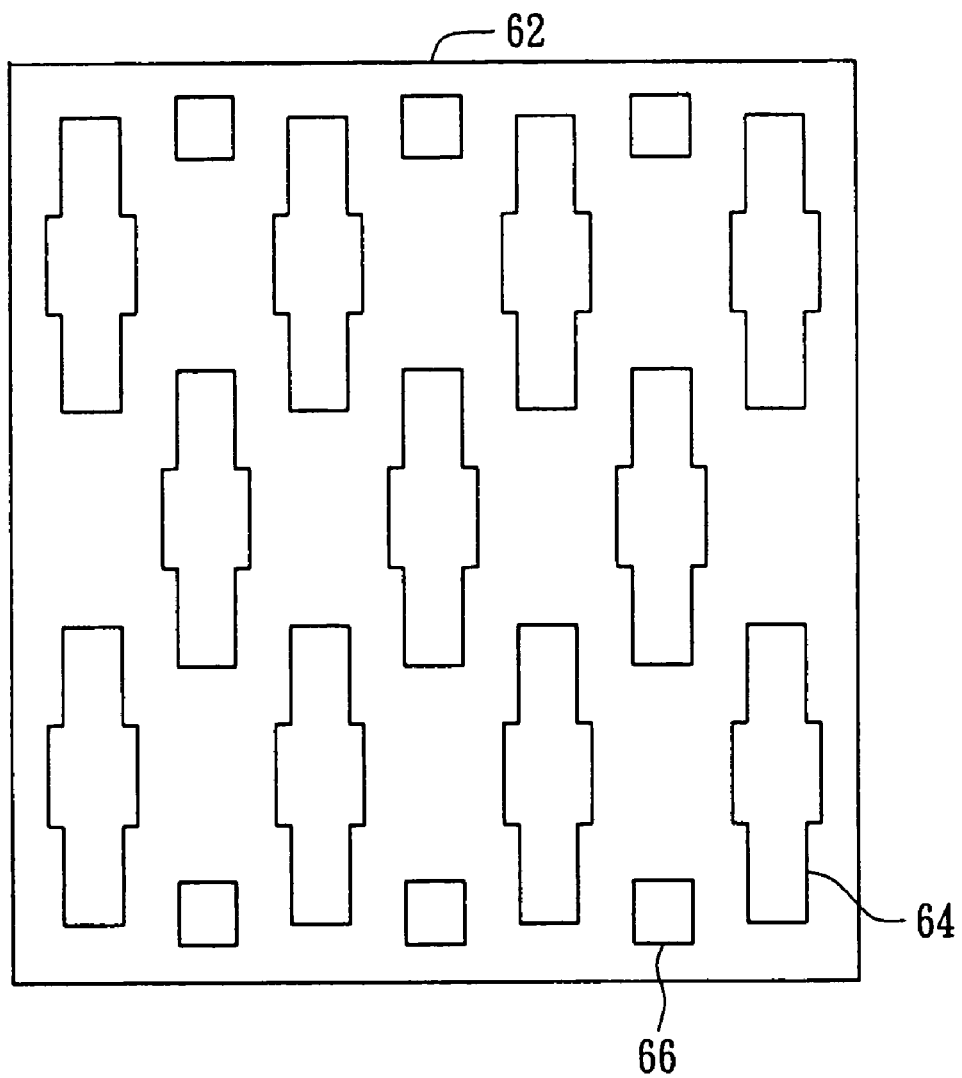
Figure 3:
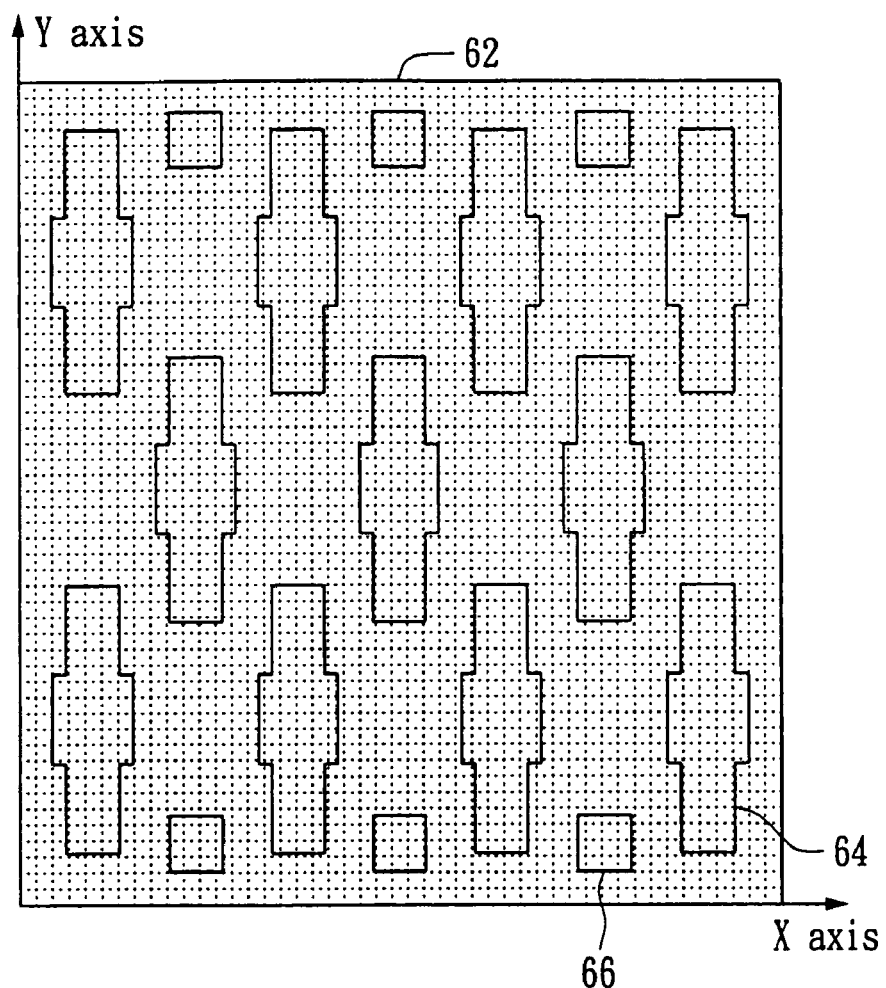
FIG. 3 to FIG. 6 illustrate a method for preparing a mask at frequency domain according to one embodiment of the present invention.

FIG. 3 to FIG. 6 illustrate a method for preparing a mask 60 at frequency domain according to one embodiment of the present invention. First, a coordinate system such as the Cartesian coordinate system is overlaid onto a circuit layout 62 having a plurality of patterns 64 and 66, and the transparency of the circuit layout 62 on coordinate points of the coordinate system is calculated. The transparency is "1" if the coordinate point is inside the patterns 64 and 66, while the transparency is "0" if the coordinate point is outside the patterns 64 and 66. Subsequently, a Fast Fourier Transform (FFT) process is performed to generate an amplitude layout 72 and a phase layout 82 from the transparency distribution of the circuit layout 62, as shown in FIG. 4(a) and FIG. 4(b), respectively.

Figure 5B:
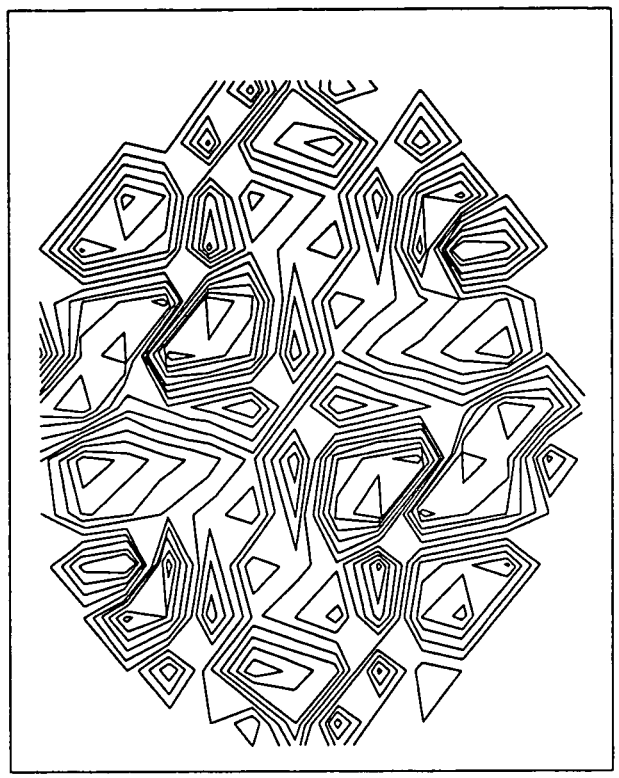
Figure 5A:
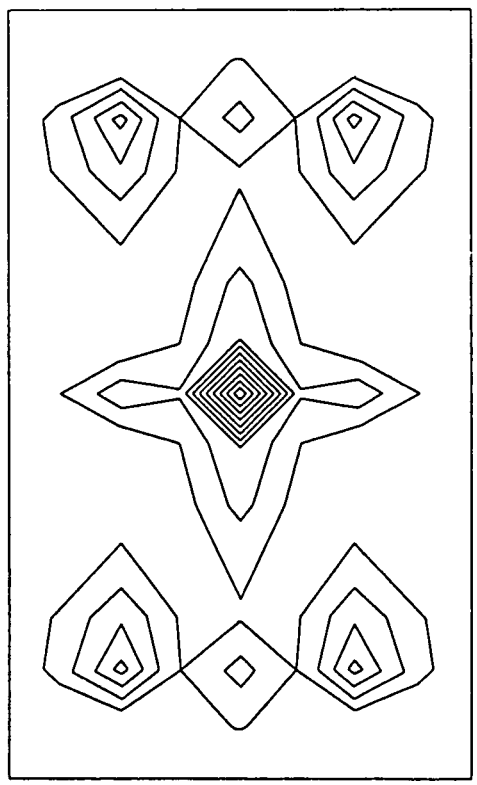

The amplitude layout 72 includes a plurality of first regions 74 having an amplitude value and the phase layout 82 includes a plurality of second regions 84 having a phase value. Preferably, the first region 74 and the second region 84 have the same size, and the number and the position of these first regions 74 correspond to those of the second regions 84. FIG. 5(a) shows a contour diagram of the amplitude layout 72, and FIG. 5(b) shows a contour diagram of the phase layout 82. One can realize the amplitude distribution of the amplitude layout 72 and the phase distribution of the phase layout 82 generated by the FFT process from the circuit layout 62.

Figure 4A:
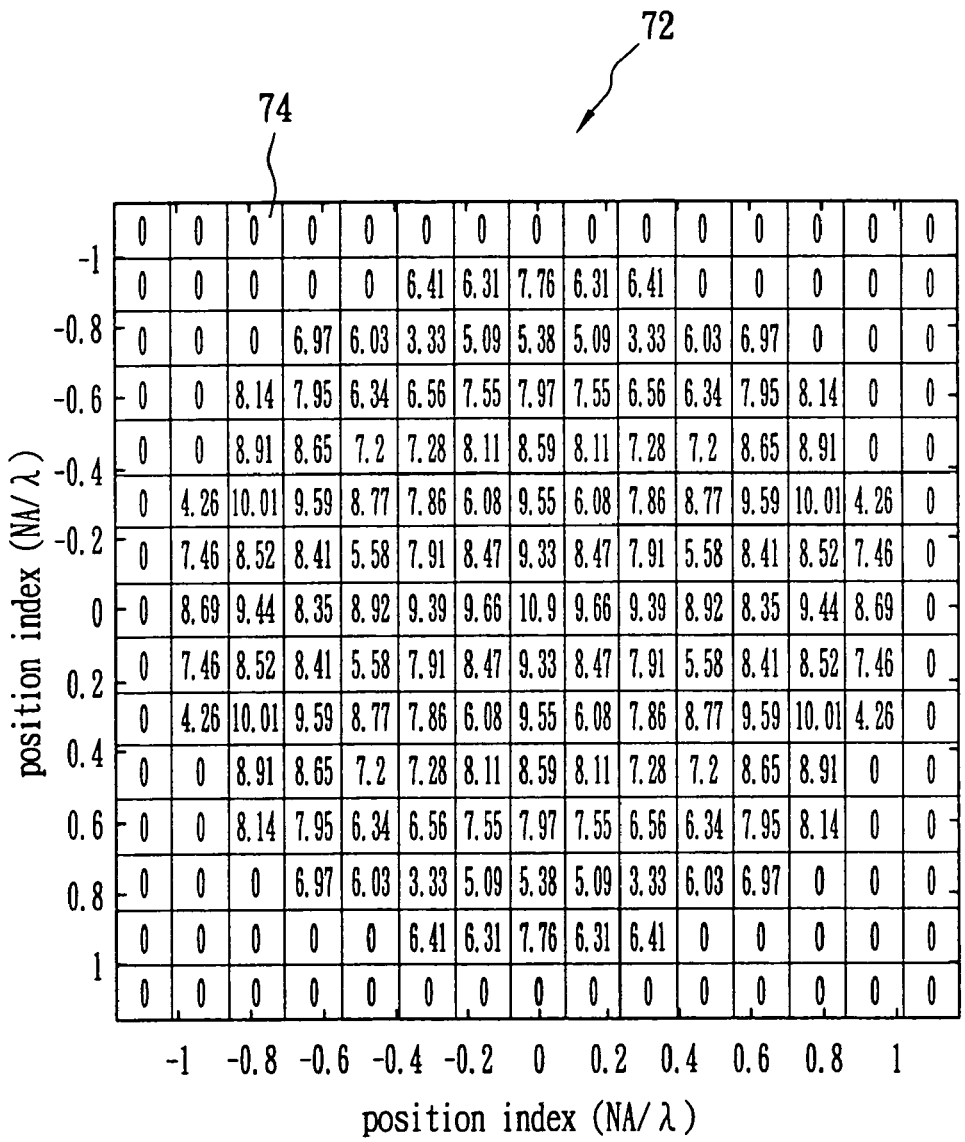
Figure 4B:
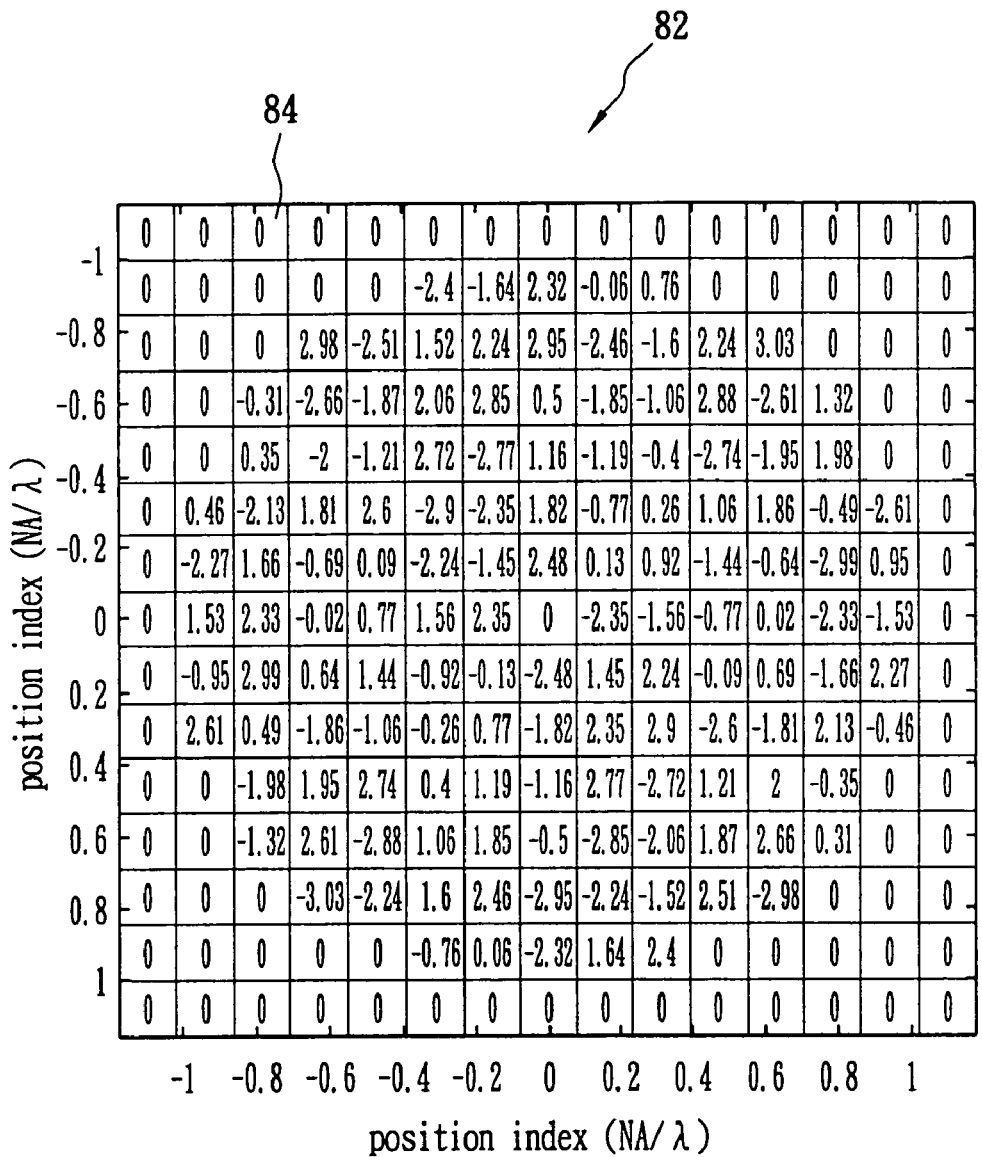
Figure 6:
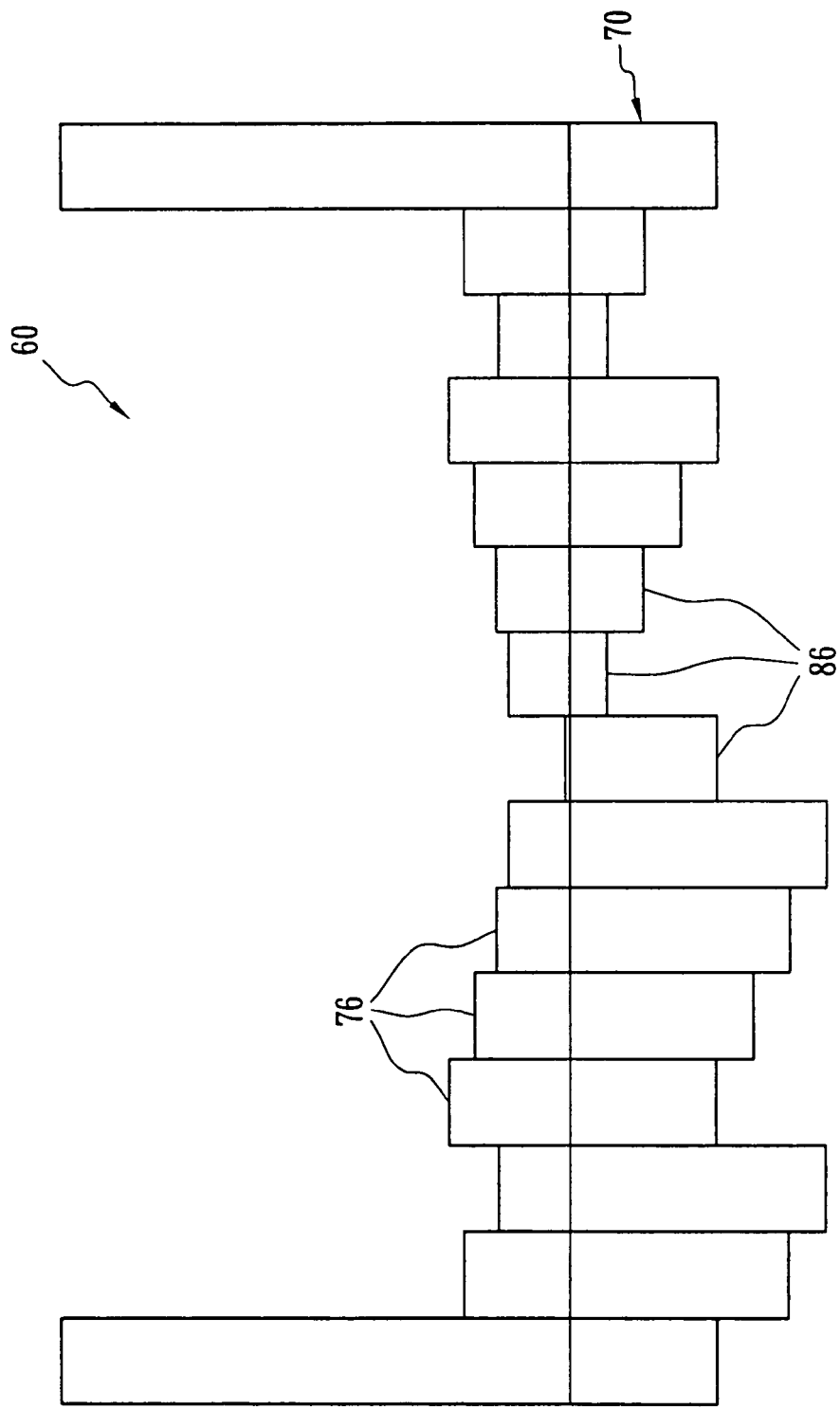

FIG. 6 is a cross-sectional diagram of the mask 60 with a lateral cross-sectional line at Y=0 in FIG. 4(a) and FIG. 4(b)

according to one embodiment of the present invention. After the FFT process is completed, a plurality of amplitude patterns 76 are formed on a top surface of a substrate 70 and a plurality of phase patterns 86 are formed on a bottom surface of the substrate 70, wherein the amplitude pattern 76 has a vertical thickness corresponding to the amplitude value of the first region 74 and the phase pattern 86 has a vertical thickness corresponding to the phase value of the second region 84.

Since the number and the position of these first regions 74 correspond to those of the second regions 84, the number and position of these amplitude patterns 76 also correspond to those of the phase patterns 86. In addition, the substrate 70 can be made of transparent material such as quartz, and these phase patterns 86 can be formed by etching the bottom surface of the substrate 70. These amplitude patterns 76 can be formed by depositing inorganic material, such as molybdenum silicide, on the top surface of the substrate 70. Preferably, the inorganic material can absorb a certain amount of incident light, and these phase patterns 86 have extinction coefficients approximate to zero for an exposing light. For example, molybdenum silicide has a refractive index of 2.343 for a beam with a wavelength of 193 nanometers, and a refractive index of 2.314 at a wavelength of 248 nanometers. Quartz has an extinction coefficient approximate to zero for an exposing light with wavelengths between 193 and 248 nanometers.

Figure 7:
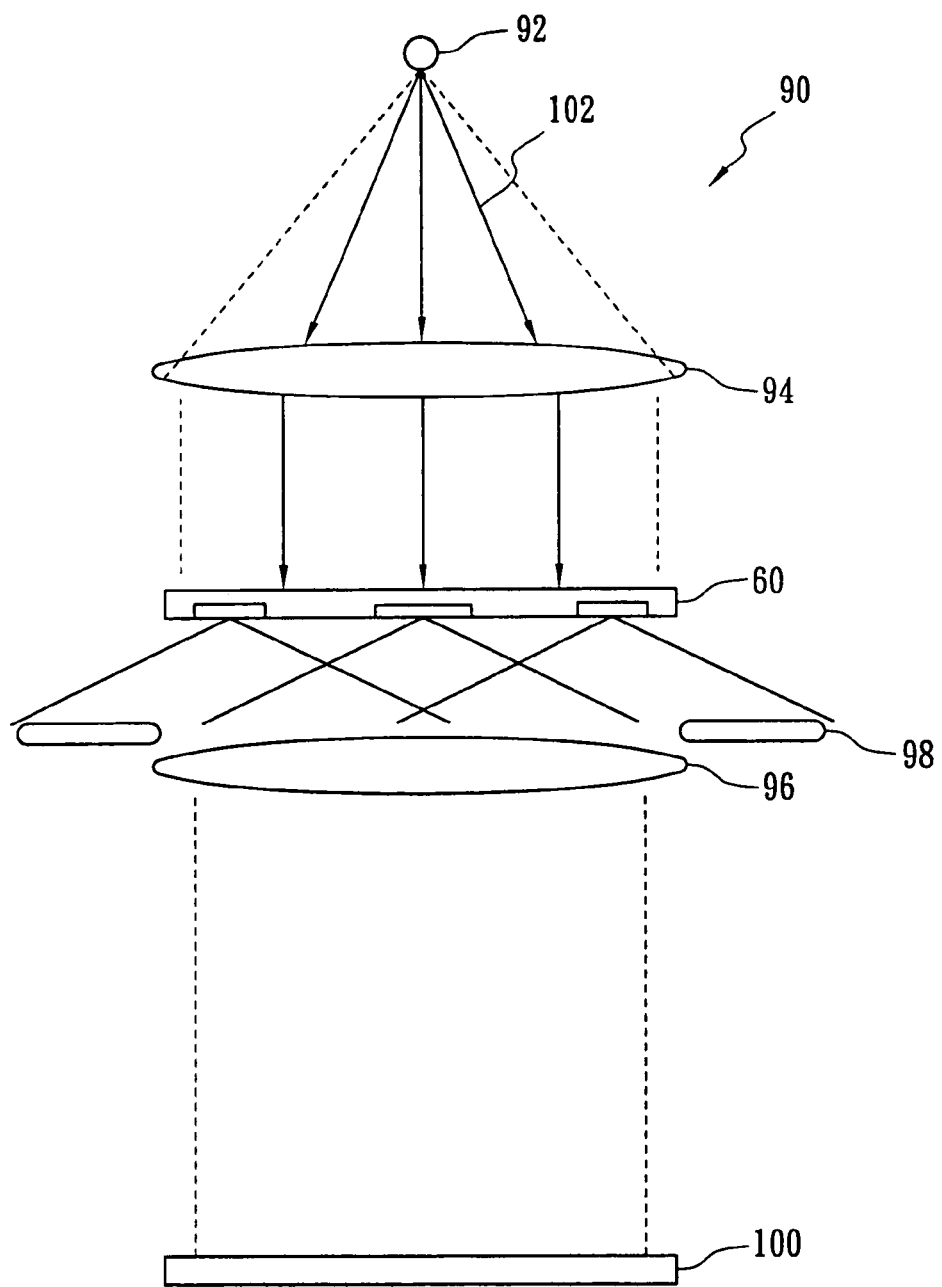
FIG. 7 illustrates an exposing system according to one embodiment of the present invention.

FIG. 7 illustrates an exposing system 90 according to one embodiment of the present invention. The exposing system 90 comprises a coherent light source 92, a mask 60, a first lens 94 positioned between the coherent light source 92 and the mask 60, a second lens 96 positioned between the mask 60 and a wafer 100, and a shielding plate 98. Preferably, the coherent light source 92 is a point light source capable of emitting an exposing light 102 to transfer the amplitude pattern 76 and the phase pattern 86 from the mask 60 onto the wafer 100 via the second lens 96, and then interferes to form a circuit layout on the wafer 100. The first lens 94 is used to transform the exposing light 102 from the coherent light source 92 into parallel beams, and the shielding plate 98 is used to exclude beams out of a pupil of the second lens 96.

Referring back to FIG. 4(a) and FIG. 4(b), the lateral and vertical coordinates of amplitude layout 72 and the phase layout 82 are normalized by a position index (NA/λ), wherein NA represents the numeral aperture of the second lens 96 and λ represents the wavelength of the exposing light 102. Particularly, only a portion of the first region 74 and the second region 84 with a position index between +1 and −1 are positioned inside the pupil of the second lens 96. Since the second lens 96 can be regarded as an inverse Fourier transform device, and the amplitude patterns 76 and phase patterns 86 on the mask 60 are the Fourier transform of the circuit layout 62, the exposing system 90 can use the second lens 96 to inversely Fourier transform the Fourier transformed information (i.e., the amplitude pattern 76 and the phase pattern 86) on the mask 60 to rebuild the circuit layout 62 onto the wafer 100 when the exposing light 102 penetrates through these amplitude patterns 76, theses phase patterns 86 and the second lens 96.

Compared to the prior art, which possesses a complex architecture and optimizes the depth of focus for only one of the several patterns in a circuit layout, the embodiment of the present invention possesses a simpler architecture and can optimize the depth of focus for all patterns in a circuit design. The conventional exposing system 10 uses the second lens 16 to perform Fourier transform of the circuit layout 62 on the mask 20, and utilizes the third lens 18 to perform inverse Fourier transform to transfer the circuit layout 62 from the mask 20 onto the wafer 30. Conversely, the present mask 60 at frequency domain combines the functions of both the conventional second lens 16 and mask 20 into one single optical device, and therefore, the present invention possesses a simpler optical architecture. In addition, conventional OAI technique optimizes the depth of focus for only one of the patterns in a circuit layout. But the present exposing system 90 possesses a theoretically infinite depth of focus, for which all patterns of the circuit layout 62 can be optimized accordingly.

The above-described embodiments of the present invention are intended to be illustrative only. Numerous alternative embodiments may be devised by those skilled in the art without departing from the scope of the following claims.

What is claimed is:

1. A mask at frequency domain, comprising:
    a plurality of amplitude patterns positioned on a first surface of the mask, wherein the amplitude patterns have different thicknesses for changing an amplitude of an exposing light; and
    a plurality of phase patterns positioned on a second surface of the mask, wherein the phase patterns have different thicknesses for changing a phase of the exposing light.

2. The mask at frequency domain of claim 1, wherein the amplitude patterns are made of inorganic material.

3. The mask at frequency domain of claim 1, wherein the amplitude patterns are made of molybdenum silicide.

4. The mask at frequency domain of claim 1, wherein the phase patterns have an extinction coefficient approximate to zero for the exposing light.

5. The mask at frequency domain of claim 1, wherein the phase patterns are made of transparent material.

6. The mask at frequency domain of claim 1, wherein the phase patterns are made of quartz.

7. The mask at frequency domain of claim 1, wherein the number and position of the amplitude patterns correspond to those of the phase patterns.

8. The mask at frequency domain of claim 1, wherein the amplitude patterns and phase patterns are a Fourier transform of a circuit layout.

9. A method for fabricating a mask at frequency domain, comprising steps of:
    performing a Fourier transform process to generate an amplitude layout and a phase layout from a circuit layout, wherein the amplitude layout includes a plurality of first regions each having an amplitude value, and the phase layout includes a plurality of second regions each having a phase value; and
    forming a plurality of amplitude patterns on a first surface of a substrate and a plurality of phase patterns on a second surface of the substrate, wherein the amplitude pattern has a thickness corresponding to the amplitude value of the first region and the phase pattern has a thickness corresponding to the phase value of the second region.

10. The method for fabricating a mask at frequency domain of claim 9, further comprising the following steps before performing the Fourier transform process:
    overlaying a coordinate system onto the circuit layout; and
    calculating a transparency of the circuit layout at coordinate points of the coordinate system.

11. The method for fabricating a mask at frequency domain of claim 9, wherein the amplitude patterns are made of inorganic material.

12. The method for fabricating a mask at frequency domain of claim 9, wherein the amplitude patterns are made of molybdenum silicide.

13. The method for fabricating a mask at frequency domain of claim 9, wherein the amplitude patterns are formed on the first surface by deposition.

14. The method for fabricating a mask at frequency domain of claim 9, wherein the phase patterns are formed on the second surface by etching.

15. The method for fabricating a mask at frequency domain of claim 9, wherein the phase patterns have an extinction coefficient approximate to zero for an exposing light.

16. The method for fabricating a mask at frequency domain of claim 9, wherein the phase patterns are made of transparent material.

17. The method for fabricating a mask at frequency domain of claim 9, wherein the phase patterns are made of quartz.

18. The method for fabricating a mask at frequency domain of claim 9, wherein the number and position of the amplitude patterns correspond to those of the phase patterns.

19. An exposing system, comprising:

A mask including a plurality of amplitude patterns positioned on a first surface of the mask and a plurality of phase patterns positioned on a second surface of the mask, wherein the amplitude patterns have different thicknesses to change an amplitude of an exposing light and the phase patterns have different thicknesses to change a phase of the exposing light;

a lens positioned between the mask and a wafer; and a coherent light source capable of emitting the exposing light, wherein the exposing light penetrates through the amplitude patterns, the phase patterns and the lens, and interferes to form a circuit layout on the wafer.

20. The exposing system of claim 19, wherein the coherent light source is a point light source.

21. The exposing system of claim 19, wherein the amplitude patterns are made of inorganic material.

22. The exposing system of claim 19, wherein the amplitude patterns are made of molybdenum silicide.

23. The exposing system of claim 19, wherein the phase patterns have an extinction coefficient approximate to zero for the exposing light.

24. The exposing system of claim 19, wherein the phase patterns are made of transparent material.

25. The exposing system of claim 19, wherein the phase patterns are made of quartz.

26. The exposing system of claim 19, wherein the number and position of the amplitude patterns correspond to those of the phase patterns.

27. The exposing system of claim 19, wherein the amplitude patterns and the phase patterns are a Fourier transform of the circuit layout.

* * * * *